(12) United States Patent
Uno

(10) Patent No.: US 6,781,414 B2
(45) Date of Patent: Aug. 24, 2004

(54) INPUT/OUTPUT BUFFER CIRCUIT

(75) Inventor: Osamu Uno, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/124,264

(22) Filed: Apr. 18, 2002

(65) Prior Publication Data

US 2003/0117171 A1 Jun. 26, 2003

(51) Int. Cl.[7] .................. H03K 19/0185; G05F 3/02
(52) U.S. Cl. ...................... 326/80; 326/58; 326/83; 326/81; 327/534; 327/537
(58) Field of Search .............. 326/57, 58, 80, 326/81, 83, 86; 327/534, 537, 546

(56) References Cited

U.S. PATENT DOCUMENTS

| | | | |
|---|---|---|---|
| 5,880,602 A | * | 3/1999 | Kaminaga et al. ............ 326/81 |
| 6,236,236 B1 | * | 5/2001 | Chen ............................ 326/81 |
| 6,353,333 B1 | * | 3/2002 | Curd et al. ................... 326/81 |

* cited by examiner

Primary Examiner—Daniel D. Chang
(74) Attorney, Agent, or Firm—Arent Fox PLLC

(57) ABSTRACT

In an input/output buffer circuit to which input signal voltage VBUS higher than power source voltage VDD is possibly inputted to an input/output terminal BUS, a gate terminal G3 is controlled by a signal in-phase to a input/output mode switching signal CNT outputted from a buffer circuit 5, and the power source voltage VDD is applied when it is an input mode. When the input signal voltage VBUS is lower than voltage obtained by applying threshold voltage Vthp of PMOS transistor to the power source voltage VDD (VBUS<VDD+Vthp), voltage obtained by subtracting threshold voltage Vthn of NMOS transistor from the power source voltage VDD is applied to a gate terminal G1 (VG1=VDD−Vthn). On condition that Vthn>Vthp, a PMOS transistor P1 gets conductive, whereby the power source voltage VDD is applied to a gate terminal G2 and PMOS transistor P2 is turned off. Thereby, an unnecessary current path is not formed. There is thus provided an input/output buffer circuit wherein unnecessary current does not flow in the input/output terminal BUS.

21 Claims, 9 Drawing Sheets

INPUT/OUTPUT BUFFER CIRCUIT DIRECTED TO FIRST EMBODIMENT

FIG. 1  INPUT/OUTPUT BUFFER CIRCUIT DIRECTED TO FIRST EMBODIMENT

FIG. 2 INPUT/OUTPUT BUFFER CIRCUIT DIRECTED TO SECOND EMBODIMENT

SPECIFIC EXAMPLE OF LEVEL CONVERTER

CHARACTERISTIC OF GATE TERMINAL VOLTAGE VG2 AT PMOS TRANSISTOR P2

INPUT/OUTPUT BUFFER CIRCUIT DIRECTED TO FIRST PRIOR ART

FIG. 7  PRIOR ART  INPUT/OUTPUT BUFFER CIRCUIT DIRECTED TO SECOND PRIOR ART

CHARACTERISTIC OF GATE TERMINAL VOLTAGE VG2 AT CONVENTIONAL PMOS TRANSISTOR P2

CHARACTERISTIC OF INFLOW CURRENT IBUS FLOWING IN CONVENTIONAL INPUT/OUTPUT TERMINAL BUS

IN CASE INTERFACE CIRCUIT INCLUDING PULL-DOWN RESISTANCE IS CONNECTED

IN CASE INTERFACE CIRCUIT INCLUDING PULL-UP RESISTANCE IS CONNECTED

INPUT/OUTPUT BUFFER CIRCUIT

BACKGROUND OF THE INVENTION

1. Field of the Invention

The present invention relates to an input/output buffer circuit. More particularly, it relates to an input/output buffer circuit wherein an input signal with voltage higher than its power source voltage is inputted to an input/output terminal 2. Description of Related Art In recent years, fine structuralizing technology with respect to CMOS-structured semiconductor integrated circuits (referred as LSI hereinafter) has advanced and driving power source voltage level of LSI has been lowering progressively. However, lowering degree of driving power source voltage level differs due to product diversity. Therefore, a plurality of LSI power source different in voltage must be combined when structuring a system. It would be preferable if terminals of LSI power source different in voltage could be connected directly. In case connecting input/output terminals, there must be considered an aspect such that an input signal with voltage amplitude different from voltage amplitude of an output signal may be inputted. Accordingly, even if a signal with voltage amplitude same as or higher than voltage amplitude of power source voltage is inputted from an external, it must be secured that an unnecessary current path is never formed between the external and the power source voltage. Therefore, various circuit systems have been proposed until now.

An input/output buffer circuit 100 shown in FIG. 6 as a first prior art is a circuit carried by the 1992 October Edition of NIKKEI MICRODEVICES (pp.83–88).

An input/output mode switching signal CNT and an output data signal DOUT are inputted to a two-input NAND logic gate 11 and to a two-input NOR logic gate 12. An output terminal of the two-input NAND logic gate 11 is connected to a gate terminal G2 of a PMOS transistor P2 which is a driving transistor arranged at high voltage side through a transfer gate 3. An output terminal of the two-input NOR logic gate 12 is connected to a gate terminal of an NMOS transistor N2 which is a driving transistor arranged at low voltage side. A signal is outputted from an input/output terminal BUS by the PMOS transistor P2 and the NMOS transistor N2.

Furthermore, to a point between gate terminal G2 of the PMOS transistor P2 and the input/output terminal BUS, there is connected a PMOS transistor P3 a gate terminal of which is connected to power source voltage VDD. Thereby, this system works such that the gate terminal G2 of the PMOS transistor P2 is clamped together with input signal voltage VBUS so that the PMOS transistor P2 should be kept non-conductive in case an input signal with voltage higher than the power source voltage VDD is inputted from the input/output terminal BUS.

Furthermore, a PMOS transistor P1 and an NMOS transistor N1 constitute the transfer gate 3. The input/output terminal BUS is connected to a gate terminal of the PMOS transistor P1 and a gate terminal of the NMOS transistor N1 is connected to the power source voltage VDD. In case an input signal with voltage higher than power source voltage VDD is inputted from the input/output terminal BUS, this system sets the NMOS transistor N1 and the PMOS transistor P1 in an off state, whereby a path leading to an output terminal of the NAND logic gate 11 from the input/output terminal BUS by way of the PMOS transistor P3 is blocked.

With respect to a PMOS transistor P10, its gate terminal, drain terminal, and source terminal are connected to the input/output terminal BUS, power source voltage VDD, and N-well NW for the PMOS transistor P1 through P3, respectively. The connection of the source terminal and the N-well NW constitutes an N-well voltage control circuit VFM1 which adjusts voltage of the N-well NW depending on voltage inputted from the input/output terminal BUS. Furthermore, in case an input signal with high voltage is inputted from the input/output terminal BUS, NMOS transistors N3 and N4 are arranged to protect an NMOS transistor N2 and an input buffer circuit 4 from high voltage.

Here will be considered a case such that an input signal with voltage same as or higher than voltage obtained by adding threshold voltage Vthp of PMOS transistor to the power source voltage VDD is applied to the input/output terminal BUS of the input/output buffer circuit 100. Input signal voltage VBUS from the input/output terminal BUS is applied to the gate terminal of the PMOS transistor P10, whereby bias of the power source voltage VDD toward the N-well NW is blocked. Through a PN-junction constituted by drain terminals of the PMOS transistors P2 and P3 to which the input/output terminal BUS is connected, voltage of the N-well NW under this state approximates a value of the input signal voltage VBUS. As a result, a junction of the N-well NW and the source terminals of the PMOS transistors P2 and P10 to which the power source voltage VDD is connected turns into a reverse bias state and current-flow toward the power source voltage VDD through the PMOS transistors P2 and P10 is blocked.

Furthermore, since the power source voltage VDD is applied to the gate terminal of the PMOS transistor P3 the drain terminal of which is connected to the input/output terminal BUS, the PMOS transistor P3 becomes conductive and the gate terminal G2 of the PMOS transistor P2 is biased to the input signal voltage VBUS. Thereby, the PMOS transistor P2 is kept in an off state and a current path running through the PMOS transistor P2 is blocked.

Furthermore, since the gate terminal of the transfer gate 3 is connected to the input/output terminal BUS, the PMOS transistor P1 is kept in an off state. On the other hand, since its drain terminal is connected to the terminal G2 biased to the input signal voltage VBUS, the NMOS transistor N1 the gate terminal of which is connected to the power source voltage VDD operates with a saturation region. Accordingly, voltage same as or higher than the power source voltage VDD is never applied to a connection terminal to the NAND logic gate 11 through the transfer gate 3, whereby a current path leading to the power source voltage VDD through the PMOS transistors constituting the NAND logic gate 11 is not established.

As described, the input/output buffer circuit 100 directed to the first prior art prevents current from flowing from the input/output terminal BUS to the power source voltage VDD in case an input signal with voltage same as or higher than voltage obtained by adding the threshold voltage Vthp of PMOS transistor to the power source voltage VDD is applied to the input/output terminal BUS.

FIG. 7 shows an input/output buffer circuit 200 directed to a second prior art. In the input/output buffer circuit 200, there is not established a direct connection between an input/output terminal BUS and a gate terminal G1 of a PMOS transistor P1 which constitutes a transfer gate 3 corresponding to the first prior art. Instead, the input/output terminal BUS and the gate terminal G1 are connected to each other through a PMOS transistor P4 a gate terminal of which is connected to the power source voltage VDD. Furthermore, the gate terminal G1 is connected to ground voltage through an NMOS transistor N5. An input/output mode switching signal CNT inverted by an inverter logic gate 6 is inputted to a gate terminal of the NMOS transistor N5.

In the input/output buffer circuit 200, high-voltage proof elements are used for an NMOS transistor N2 and an input stage of and an input buffer circuit 4. Therefore, the NMOS transistors N3 and N4 arranged as protection from high voltage in the input/output buffer circuit 100 are not required in the second prior art. That is, the NMOS transistor N2 and the input buffer circuit 4 are directly connected to the input/output terminal BUS.

Furthermore, instead of the N-well voltage control circuit VFM1 in the input/output buffer circuit 100, an N-well voltage control circuit VFM 2 is arranged in the input/output buffer circuit 200. The N-well voltage control circuit VFM 2 is constituted by: a PMOS transistor P10 source terminal, drain terminal, and gate terminal of which are connected to the power source voltage VDD, the N-well NW, and the input/output terminal BUS, respectively, and; a PMOS transistor P11 source terminal, drain terminal and back-gate terminal, and gate terminal of which are connected to the input/output terminal BUS, the N-well NW, and the power source voltage VDD, respectively. Thereby, the system works such that voltage at the N-well NW can be switched between the power source voltage VDD and the input signal voltage VBUS depending on a value of input signal voltage VBUS at the input/output terminal BUS.

In the input/output buffer circuit 200, the PMOS transistor P4 the gate terminal of which is connected to the power source voltage VDD becomes conductive in case an input signal with voltage same as or higher than voltage obtained by adding the threshold voltage Vthp of PMOS transistor to the power source voltage VDD is applied to the input/output terminal BUS. Further on, in this case, an input/output mode switching signal CNT is high logic level and an NMOS transistor N5 is in an off state. Therefore, an input signal from the input/output terminal BUS is applied to the gate terminal G1 of the PMOS transistor P1 and the PMOS transistor P1 is turned off for sure. Accordingly, a current path leading to the power source voltage VDD through the PMOS transistor constituting the NAND logic gate 11 is not established. Furthermore, it is same as the first prior art that a current path leading to the power source voltage VDD through a PN junction of the PMOS transistors P2 and P10 and a current path leading to the power voltage VDD through the PMOS transistor P2 are blocked. The input/output buffer terminal 200 thus prevents current from flowing into the power source voltage VDD from the input/output terminal BUS in case an input signal with voltage same as or higher than voltage obtained by adding the threshold voltage Vthp of PMOS transistor to the power source voltage VDD is applied to the input/output terminal BUS.

However, on condition that, as for absolute value, a threshold Vthp of PMOS transistor is lower than a threshold Vthn of NMOS transistor, i.e., (Vthn>Vthp), due to device structure of LSI, manufacturing conditions, or the like, the input/output buffer circuits 100 and 200 may face a problem such that unnecessary inflow current IBUS flows into the input/output terminal BUS in case a value of an input signal voltage VBUS inputted to the input/output terminal BUS is not optimum.

There will be described conditions that inflow current IBUS flows specifically by referring to gate terminal voltage VG2 at the PMOS transistor P2 responsive to the input signal voltage VBUS (see FIG. 8), and inflow current IBUS responsive to the input signal voltage VBUS (see FIG. 9).

Here will be considered a case that the input/output buffer circuit 100 (see FIG. 6) works as input buffer and receives an input signal from the input/output terminal BUS. In this case, the PMOS transistor P2 constituting an output buffer section must be kept in an off state. In case the input signal voltage VBUS is same as or higher than (VDD+Vthp), the PMOS transistor P1 is turned off and the PMOS transistor P3 becomes conductive, whereby the gate terminal voltage VG2 is equivalent to the input signal voltage VBUS (①) in FIG. 8). Furthermore, in case the input signal voltage VBUS is same as or lower than (VDD−Vthp), though the PMOS transistor P3 is turned off, the PMOS transistor P1 becomes conductive. Therefore, the gate terminal voltage G2 is equivalent to the power source voltage VDD (③ in FIG. 8). Accordingly, in both cases, namely, (VBUS>VDD+Vthp) (① in FIG. 8, and (VBUS<VDD−Vthp) ③ in FIG. 8, the PMOS transistor P2 is kept in an off state. Accordingly, inflow current IBUS does not flow from the input/output terminal BUS (① and ③ in FIG. 9).

However, in case voltage level of the input signal voltage VBUS is between (VDD−Vthp) and (VDD+Vthp), the PMOS transistors P1 and P3 are in an off state. Consequently, the NMOS transistor N1 which becomes conductive depending on saturation characteristic applies voltage minimum of which is (VDD−Vthp) to the gate terminal G2 (② in FIG. 8). On condition that it is (Vthn>Vthp), the PMOS transistor P2 cannot be kept in an off state and this situation allows inflow current IBUS to flow from the input/output terminal BUS. This is a problematic aspect of the prior art.

That is, in case voltage level of the input signal voltage VBUS is between (VDD−Vthp) and (VDD), unnecessary current IBUS flows out from the power source voltage VDD in the LSI through the input/output terminal BUS (②A in FIG. 9) whereas in case between (VDD) and (VDD+Vthp), unnecessary current IBUS flows into the internal of the LSI from the input/output terminal BUS (②B in FIG. 9). This is also a problematic aspect of the prior arts.

As for the input/output buffer circuit 200, in case of (VBUS>VDD+Vthp), the PMOS transistor P1 is turned off and the PMOS transistor P3 becomes conductive, whereby the PMOS transistor P2 is kept in an off state and inflow current IBUS does not flow from the input/output terminal BUS. This aspect is similar to the input/output buffer circuit 100.

However, in case of (VBUS<VDD+Vthp), the PMOS transistor P3 as well as the PMOS transistor P4 are turned off, whereby the gate terminal G1 of the PMOS transistor P1 turns into a floating state. In case the gate terminal voltage VG1 is kept between (VDD−Vthp) and (VDD+Vthp) under this situation, the PMOS transistor P2 cannot be kept in an off state, similar to the input/output buffer circuit, inflow current IBUS flows from the input/output terminal BUS. This is also a problematic aspect. Furthermore, with respect to the input/output buffer circuit 100, since presence/absence of the inflow current IBUS depends on the gate terminal voltage G1 in a floating state, there occurs a problem that inflow current IBUS may flow even though it is (VBUS<VDD−Vthp) where the inflow current IBUS is not supposed to flow.

Furthermore, in case the structure of an interface circuit to be connected to the input/output terminal BUS is not an appropriate one, inflow current IBUS flows due to a connection to the interface circuit. As a result, the input/output terminal BUS cannot be set to a predetermined voltage level.

FIG. 10 shows a case that an interface circuit including a pull-down resistance Rpd is connected to the input/output terminal BUS. A switch element SW1 is arranged there so as to apply external voltage to the input/output terminal BUS. When the switch element SW1 becomes conductive and the external voltage Vt is applied to the input/output terminal BUS, if voltage level of the external voltage Vt is (VDD−Vthp≦Vt<VDD+Vthp), the PMOS transistor P2 becomes conductive. In case the switch element SW1 is turned off and the pull-down resistance Rpd is connected to the input/output terminal BUS from this situation, if a divided voltage ratio of an ON-resistance RP2 of the PMOS transistor P2 and the pull-down resistance Rpd is not an appropriate one, voltage of (VDD−Vthp≦VBUS<VDD+Vthp) may be continuously applied. In this case, unnecessary current IBUS keeps flowing to the external and the input signal voltage VBUS at the input/output terminal BUS does not reach low level voltage which is pulled-down. This is a problematic aspect. The input signal voltage VBUS at this moment satisfies an expression as below.

$$VBUS=VDD\times Rpd/(Rpd+RP2)$$

This is problematic because voltage level of (VDD−Vthp≦VBUS<VDD+Vthp) is kept.

FIG. 11 shows a case that an interface circuit including a pull-up resistance Rpu is connected to the input/output terminal BUS. A switch element SW2 is arranged there so as to apply ground voltage to the input/output terminal BUS. In case terminal voltage VBUS is (VDD−Vthp≦Vt<VDD+Vthp) when the switch element SW2 is turned off and the input/output terminal BUS is pulled up to the external voltage Vt, the PMOS transistor P2 becomes conductive. If a divided voltage ratio of an ON-resistance RP2 of the PMOS transistor P2 and the pull-up resistance Rpu is not an appropriate one, voltage of (VDD−Vthp≦VBUS<VDD+Vthp) may be continuously applied. In this case, unnecessary current IBUS keeps flowing in from the external and the input signal voltage VBUS at the input/output terminal BUS does not reach high level voltage which is pulled-up. The input signal voltage VBUS at this moment satisfies an expression as below.

$$VBUS=(Vt-VDD)\times RP2/(Rpu+RP2)+VDD$$

This is problematic because voltage level of (VDD≦VBUS<VDD+Vthp) is kept.

SUMMARY OF THE INVENTION

The present invention, attempted to resolve the above-noted problems of the prior arts, is intended to provide an input/output buffer circuit capable of preventing unnecessary current from flowing between power source voltage and an input signal applied externally, wherein an input signal with voltage higher than the power source voltage is inputted to an input/output terminal.

In order to achieve the above-stated object, in accordance with one aspect of the present invention, there is provided an input/output buffer circuit to which an input signal with voltage same as or higher than its power source voltage is possibly inputted through an input/output terminal when it is an input mode, wherein voltage at a gate terminal of a driving PMOS transistor, which drives the input/output terminal when it is an output mode, is set to an input signal voltage when the input signal voltage is in a first region corresponding to voltage values same as or higher than voltage obtained by adding predetermined voltage to the power source voltage, and voltage at the gate terminal of the driving PMOS transistor, which drives the input/output terminal when it is an output mode, is set to the power source voltage when the input signal voltage is in a second region corresponding to voltage values lower than the voltage obtained by adding predetermined voltage to the power source voltage.

In the input/output buffer circuit directed to the one aspect of the present invention, setting voltage at the gate terminal of the driving PMOS transistor for an input/output terminal is switched depending on input signal voltage to be inputted to the input/output terminal under an input mode. In the first region, namely, when input signal voltage is same as or higher than the voltage obtained by adding predetermined voltage to the power source voltage, gate terminal voltage of the driving PMOS transistor is equal to input/output terminal voltage. In the second region, namely, when input signal voltage is lower than the voltage obtained by adding predetermined voltage to the power source voltage, gate terminal voltage of the driving PMOS transistor is equal to the power source voltage.

Thereby, even if a value of the input signal voltage to be inputted to the input/output terminal varies under an input mode, voltage set at the gate terminal of the driving PMOS transistor keeps the driving PMOS transistor non-conductive state. Therefore, an unnecessary current path is not formed between the input/output terminal and the power source voltage through the driving PMOS transistor. Thereby, unnecessary inflow/outflow of current from the input/output terminal can be avoided. Furthermore, since there is no unnecessary inflow/outflow of current, the input/output terminal can be set to predetermined voltage level.

The above and further objects and novel features of the invention will more fully appear from the following detailed description when the same is read in conjunction with the accompanying drawings. It is to be expressly understood, however, that the drawings are for the purpose of illustration only and are not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

A first and second Embodiments of the inventive input/output buffer circuit will be described by referring to FIG. 1 through FIG. 5.

Figure 1:
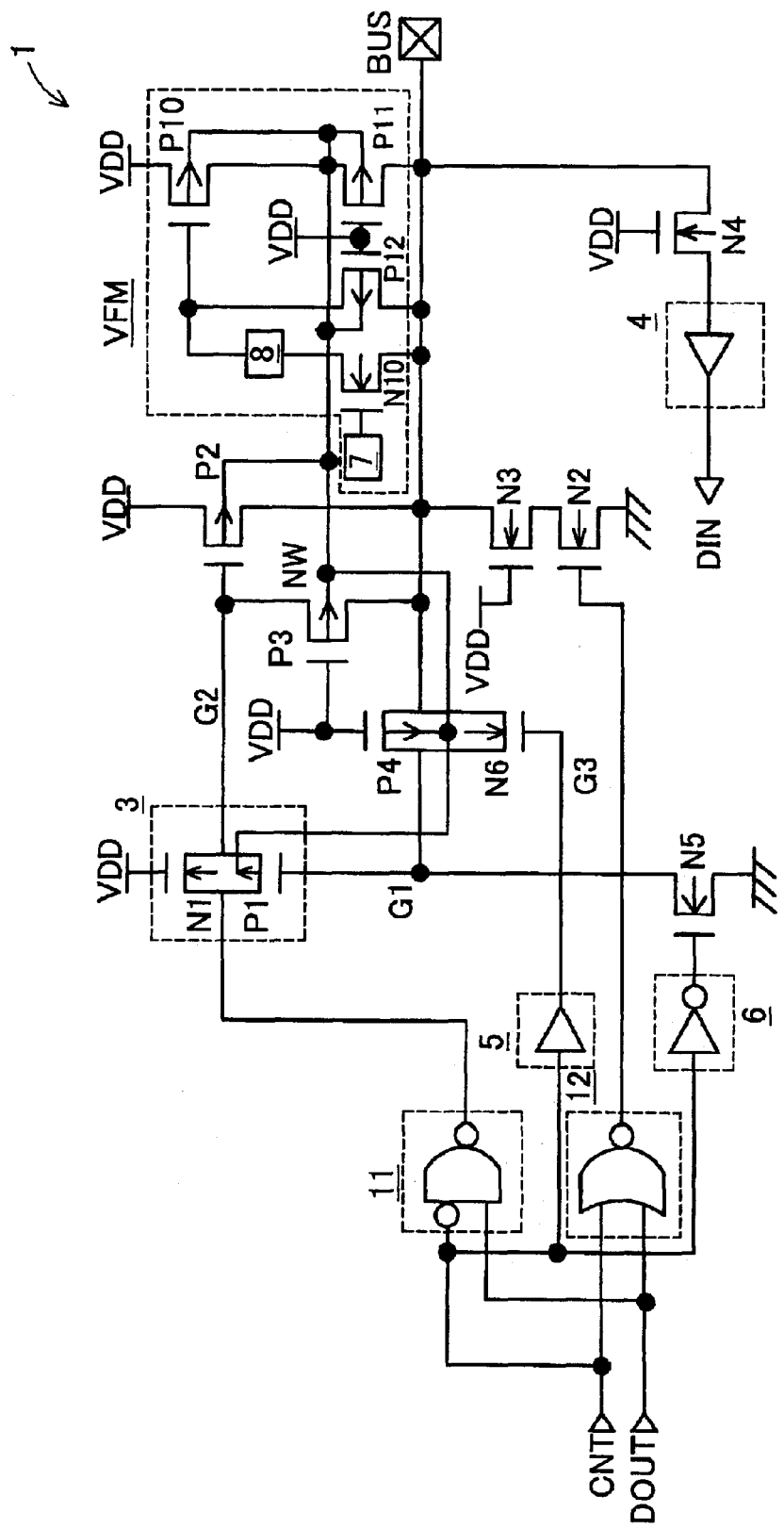
FIG. 1 shows an input/output buffer circuit directed to a first embodiment.

FIG. 1 shows an input/output buffer circuit directed to the first embodiment. Instead of the NMOS transistor N2 for high-voltage proof and the input buffer circuit 4 of the input/output buffer circuit 200 directed to the second prior art, an NMOS transistor N2 and an input buffer circuit 4 structured same as those of the input/output buffer circuit 100 directed to the first prior art and NMOS transistors N3 and N4 for protection from high voltage are arranged in the input/output buffer circuit 1.

Furthermore, instead of structure of the input/output buffer circuit 200, the input/output buffer circuit 1 includes a PMOS transistor P4 which serves as second PMOS transistor and an NMOS transistor N6 which serves as a second NMOS transistor are arranged in parallel to each other. The PMOS transistor P4 and the NMOS transistor N6 constitute a second transfer gate. The second transfer gate controls gate terminal voltage VG1 at a PMOS transistor P1 which serves as first PMOS transistor. A gate terminal G3 of the NMOS transistor N6 is connected to an output terminal of a buffer circuit 5 to which an input/output mode switching signal CNT is inputted. The gate terminal G3 of the NMOS transistor N6 is controlled by a signal which is in-phase of an input/output mode switching signal CNT.

An N-well voltage control circuit VFM is structured such that a PMOS transistor P12, an NMOS transistor N10, a first voltage lowering section 8 and a second voltage lowering section 7 are added to the N-well voltage control circuit VFM2 of the input/output buffer circuit 200. A drain terminal of the NMOS transistor N10 is connected to an input/output terminal BUS and a source terminal of that is connected to a gate terminal of the PMOS transistor P10 through the first voltage lowering section 8 on demand. A gate terminal of the NMOS transistor N10 is biased through the second voltage lowering section 7. Furthermore, between the gate terminal of the PMOS transistor P10 and the input/output terminal BUS, there is arranged a PMOS transistor P12 a gate terminal and a back-gate terminal of which are connected to power source voltage VDD and an N-well NW, respectively.

The second voltage lowering section 7 outputs predetermined voltage lower than the power source voltage VDD so as to get the gate terminal of the NMOS transistor N10 biased to the predetermined voltage. In case input signal voltage VBUS from the input/output terminal BUS inputted to the drain terminal of the NMOS transistor N10 lowers voltage obtained by subtracting threshold voltage Vthn of the NMOS transistor N10 from the predetermined voltage, the input signal voltage VBUS is outputted to the source terminal of the NMOS transistor N10 as it is. In case it exceeds voltage obtained by subtracting the threshold voltage Vthn from the predetermined voltage, the voltage obtained by subtracting the threshold voltage Vthn from the predetermined voltage is outputted.

Accordingly, voltage applied to the gate terminal of the PMOS transistor P10 is limited to the same as or lower than voltage obtained by subtracting the threshold voltage Vthn from the predetermined voltage on condition before the first voltage lowering section 8 lowers voltage at the gate terminal of the PMOS transistor P10. As long as the predetermined voltage outputted from the second voltage lower section 7 is set down to somewhat lowered predetermined voltage from power source voltage VDD, voltage same as or higher than the threshold voltage Vthp is surely applied to a point between the gate terminal and the source terminal of the PMOS transistor P10 even if the source terminal of the NMOS transistor N10 and gate terminal of the PMOS transistor P10 are connected directly without the first voltage lowering section 8. That is, the predetermined voltage should be set depending on large/small relation between threshold voltage Vthn and threshold voltage Vthp of the PMOS transistor P10. Thereby, voltage to be applied to the gate terminal of the PMOS transistor P10 can be set to voltage obtained by lowering the power source voltage VDD by voltage same as or higher than the threshold voltage Vthp. Since the PMOS transistor P10 becomes conductive taking linear operation, the N-well NW can be biased to the power source voltage VDD for sure.

The first voltage lowering section 8 lowers voltage from the source terminal of the NMOS transistor N10 so as to get the gate terminal of the PMOS transistor P10 biased. Thereby, regardless of presence/absence of the second voltage lowering section 7, voltage obtained by appropriately lowering voltage from the source terminal of the NMOS transistor N10 can be applied to the gate terminal of the PMOS transistor P10. Voltage same as or higher than the threshold voltage Vthp is surely applied to a point between the gate terminal and the source terminal of the PMOS transistor P10. Since the PMOS transistor P10 becomes conductive taking linear operation, the N-well NW can be biased to the power source voltage VDD for sure.

Furthermore, even if both the first voltage lowering section 8 and the second voltage lowering section 7 are not arranged, voltage same as or higher than the threshold voltage Vthp can surely be applied to a point between the gate terminal and the source terminal of the PMOS transistor P10 under condition of (Vthn>Vthp).

This condition continues until the input signal voltage VBUS exceeds a voltage value (VDD+Vthp). After the input signal voltage VBUS has exceeded the the voltage value (VDD+Vthp), the PMOS transistor P12 becomes conductive, whereby the gate terminal of the PMOS transistor P10 is biased to the input signal voltage VBUS to make the PMOS transistor P10 non-conductive. At the same time, since the PMOS transistor P11 is made conductive, the N-well NW is biased to the input signal voltage VBUS, instead of the power source voltage VDD.

With the aid of the N-well voltage control circuit VFM, since potential of N-well NW is biased to either the power source voltage VDD or the input signal voltage VBUS continuously depending on a value of the input signal voltage VBUS to be applied to the input/output terminal BUS, a floating state never occurs there. Therefore, potential of the N-well NW can surely be set in response to any values of the input signal voltage VBUS at the input/output terminal BUS. Thereby, stable circuit operation can be secured constantly in the input/output buffer circuit 1 regardless of input state or output state.

In case voltage level of an input/output mode switching signal CNT is low logic level, the input/output buffer circuit 1 turns into an output mode so that the PMOS transistor P2 and the NMOS transistor N2 conduct output buffer operation as driving transistor for the input/output terminal BUS.

The input/output mode switching signal CNT in low logic level is inputted to one of two input terminals of the two-input NAND logic gate 11 as a logic signal with its logic inversed as well as inputted to one of two input terminal of the two-input NOR logic gate 12 as logic signal status quo. Accordingly, the NAND logic gate 11 and the NOR logic gate 12 in this case serve as logic inverting gate. Being inputted to the other input terminals of the NAND logic gate 11 and the NOR logic gate 12, an output data signal DOUT is inverted through the NAND logic gate 11 and the NOR logic gate 12 and inputted to the transfer gate 3 and the NMOS transistor N2.

In response to an output data signal DOUT in low level, the NMOS transistor N2 becomes conductive, whereby a low-logic level signal of ground voltage is outputted to the input/output terminal BUS. In response to an output data signal DOUT in high level, the PMOS transistor P2 becomes conductive through the transfer gate 3, whereby high-logic level signal of the power source voltage VDD is outputted to the input/output terminal BUS.

Since the gate terminal G2 of the PMOS transistor P2 turns into low logic level and the PMOS transistor P2 becomes conductive state, the gate terminal G1 of the PMOS transistor P1 constituting the transfer gate 3 needs to be biased to voltage which makes the PMOS transistor P1 conductive. A path between the gate terminal G1 and the input/output terminal BUS is blocked due to the following reasons: (1) the power source voltage VDD is applied to its gate terminal, whereby the PMOS transistor P4 is non-conductive; and (2) a low-logic level signal of in-phase to an input/output mode switching signal CNT is applied to the gate terminal G3 through the buffer circuit 5, whereby the NMOS transistor N6 becomes non-conductive. A high-logic level signal of opposite-phase to the input/output mode switching signal CNT is applied through the inverter logic gate 6, whereby the NMOS transistor N5 becomes conductive. Subsequently, the gate terminal G1 is connected to the ground voltage and the PMOS transistor P1 becomes conductive.

In case voltage level of an input/output mode switching signal CNT is high logic level, it is set in an input mode. Thereby, there is conducted input buffer operation to receive an input signal from the input/output terminal BUS through the input buffer circuit 4 and accept an input data signal DIN.

In input mode, an input/output mode switching signal CNT in high logic is inputted to one of two input terminals of the two-input NAND logic gate 11 as a logic signal with its logic inversed as well as to one of two input terminals of the two-input NOR logic gate 12 as logic signal status quo. Thereby, both the NAND logic gate 11 and the NOR logic gate 12 become non-active. That is, a high-logic level signal is outputted from the NAND logic gate 11 whereas a low-logic level signal is outputted from the NOR logic gate 12. These output signals serve as logic signal to make the NAND logic gate 11 and the NOR logic gate 12 non-conductive, whereby function as output buffer is made non-active.

That is, the input/output buffer circuit 1 is activated as input buffer and the input buffer circuit 4 is activated, accordingly. The PMOS transistor P1, the NMOS transistor N6, and its control circuit are controlled depending on a value of the input signal voltage VBUS to be inputted to the input/output terminal BUS. That is, it is a structure constituted by the PMOS transistor P1, the NMOS transistor N6 biasing the gate terminal G1 of the PMOS transistor P1, and its control circuit that prevents unnecessary inflow current IBUS between the input/output terminal BUS and the power source voltage VDD from flowing even if the input signal voltage VBUS higher than the power source voltage VDD is inputted.

Since the input/output mode switching signal CNT is high logic level, the signal is logically inverted and the NMOS transistor N5 is non-conductive. On the other hand, a high logic signal of the power source voltage VDD or the like is applied to the gate terminal G3 of the NMOS transistor N6 through the buffer circuit 5. The NMOS transistor N6 operates along with either non-saturating characteristic or saturating characteristic depending on voltage level of the input signal voltage VBUS to be inputted to the input/output terminal BUS. Similar to the PMOS transistor P4, the NMOS transistor N6 has a characteristic to apply voltage obtained by subtracting threshold voltage Vthn of NMOS transistor from the input signal voltage VBUS or from the power source voltage VDD to the gate terminal G1.

Figure 4:
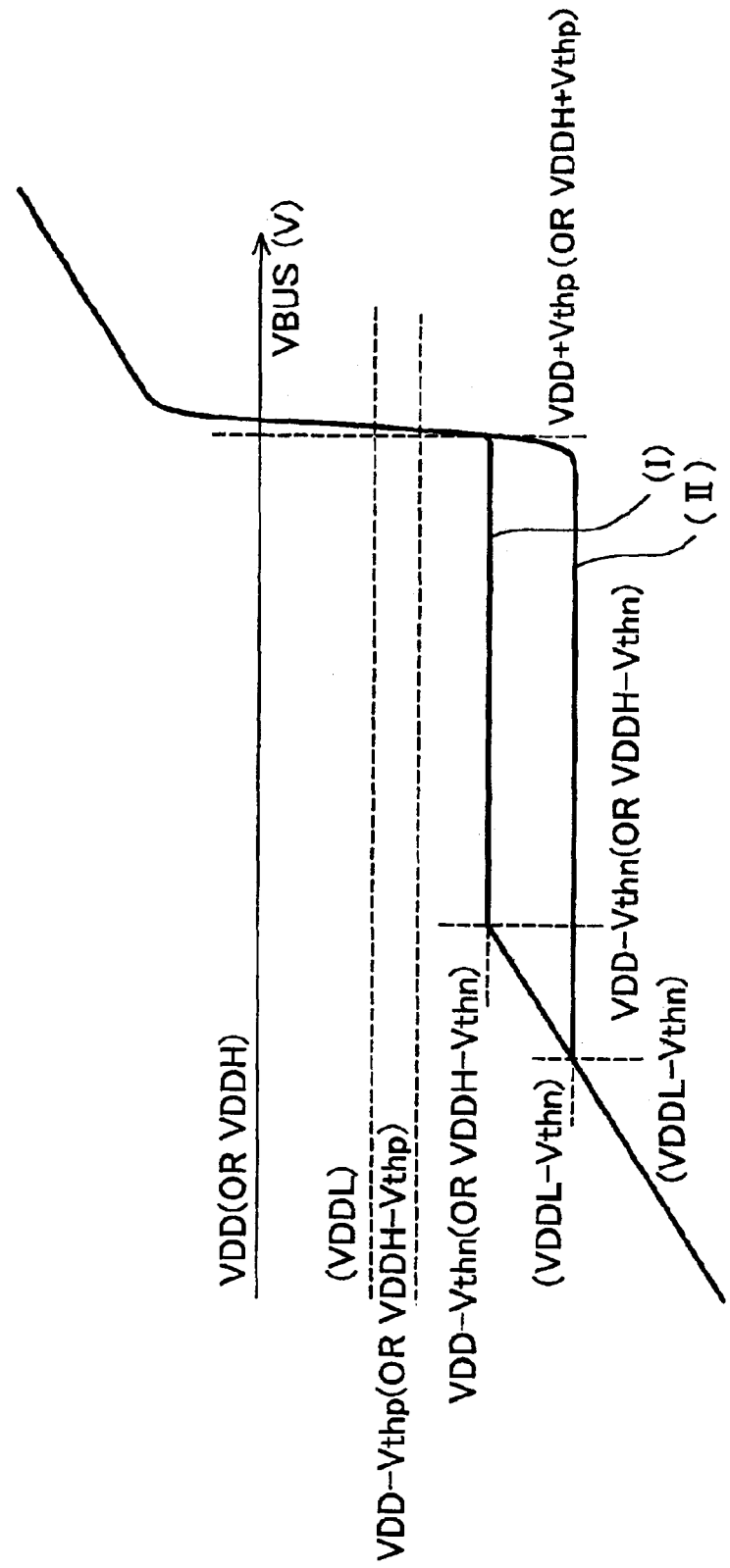
FIG. 4 is a diagram showing a characteristic of gate terminal voltage VG1 at a PMOS transistor P1 directed to the present embodiments.

Characteristics of the gate terminal voltage VG1 responsive to the input signal voltage VBUS will be described by referring to FIG. 4. Here will be described a case that the power source voltage VDD is applied to the gate terminal G3 as an example ((I) in FIG. 4). Description will go disregarding voltage-drop components of ON-resistance of the PMOS/NMOS transistors, wiring resistance and the like.

In case the input signal voltage VBUS is same as or lower than voltage obtained by subtracting threshold voltage Vthn from the power source voltage VDD (0≦VBUS<VDD−Vthn), the NMOS transistor N6 becomes conductive in a non-saturating region and the gate terminal voltage VG1 coincide with the input signal voltage VBUS (VG1=VBUS). Provided that it is (Vthn>Vthp), the gate to source terminal voltage of the PMOS transistor P1 is biased to a voltage value same as or higher than the threshold Vthp, whereby the NAND logic gate 11 outputting high-logic level signal of the power source voltage VDD in an input mode and the gate terminal G2 become conductive (VG2=VDD). Accordingly, it becomes (VG2>VBUS), whereby the PMOS transistor P2 is kept in a non-conductive state and a current path is not formed between the input/output terminal BUS and the power source voltage VDD.

In case the input signal voltage VBUS is same as or higher than voltage obtained by subtracting threshold voltage Vthn from the power source voltage VDD and is same as or lower than voltage obtained by subtracting threshold voltage Vthp from the power source voltage VDD (VDD−Vthn≦VBUS<VDD−Vthp), the NMOS transistor N6 becomes conductive in a saturating region and voltage obtained by subtracting threshold voltage Vthn from the power source voltage VDD is applied to the gate terminal voltage VG1 (VG1=VDD−Vthn). Provided that it is (Vthn>Vthp), the gate to source terminal voltage of the PMOS transistor P1 is biased to a voltage value same as or higher than the threshold Vthp, whereby the NAND logic gate 11 outputting high-logic level signal of the power source voltage VDD in an input mode and the gate terminal G2 become conductive (VG2=VDD). Accordingly, it becomes (VG2>VBUS), whereby the PMOS transistor P2 is kept in a non-conductive state and a current path is not formed between the input/output terminal BUS and the power source voltage VDD.

In case the input signal voltage VBUS is same as or higher than voltage obtained by subtracting threshold voltage Vthp from the power source voltage VDD and is lower than voltage obtained by adding threshold voltage Vthp to the power source voltage VDD (VDD−Vthp≦VBUS<VDD+Vthp), the NMOS transistor N6 becomes conductive in a saturating region and voltage obtained by subtracting threshold voltage Vthn from the power source voltage VDD is applied to the gate terminal voltage VG1 (VG1=VDD−Vthn). Provided that it is (Vthn>Vthp), the gate to source terminal voltage of the PMOS transistor P1 is biased to a voltage value same as or higher than the threshold Vthp, whereby the NAND logic gate 11 and the gate terminal G2 become conductive and the power source voltage VDD is applied (VG2=VDD). In this case, it becomes (VG2>VBUS), since bias voltage is same as or lower than threshold voltage Vthp, the PMOS transistor P2 is kept in a non-conductive state and a current path is not formed between the input/output terminal BUS and the power source voltage VDD.

In case the input signal voltage VBUS is same as or higher than voltage obtained by adding threshold voltage Vthp to the power source voltage VDD (VDD+Vthp≦VBUS), the PMOS transistor P4 becomes conductive in a non-saturating region and the input signal voltage VBUS is applied to the gate terminal voltage VG1 (VG1=VBUS). Accordingly, the PMOS transistor P1 becomes non-conductive. However, in this state, the PMOS transistor P3 becomes conductive, whereby the gate terminal voltage VG2 is applied to the input signal voltage VBUS (VG2=VBUS). Since it is (VG2=VBUS), the PMOS transistor P2 is kept in a non-conductive state and a current path is not formed between the input/output terminal BUS and the power source voltage VDD.

Figure 5:
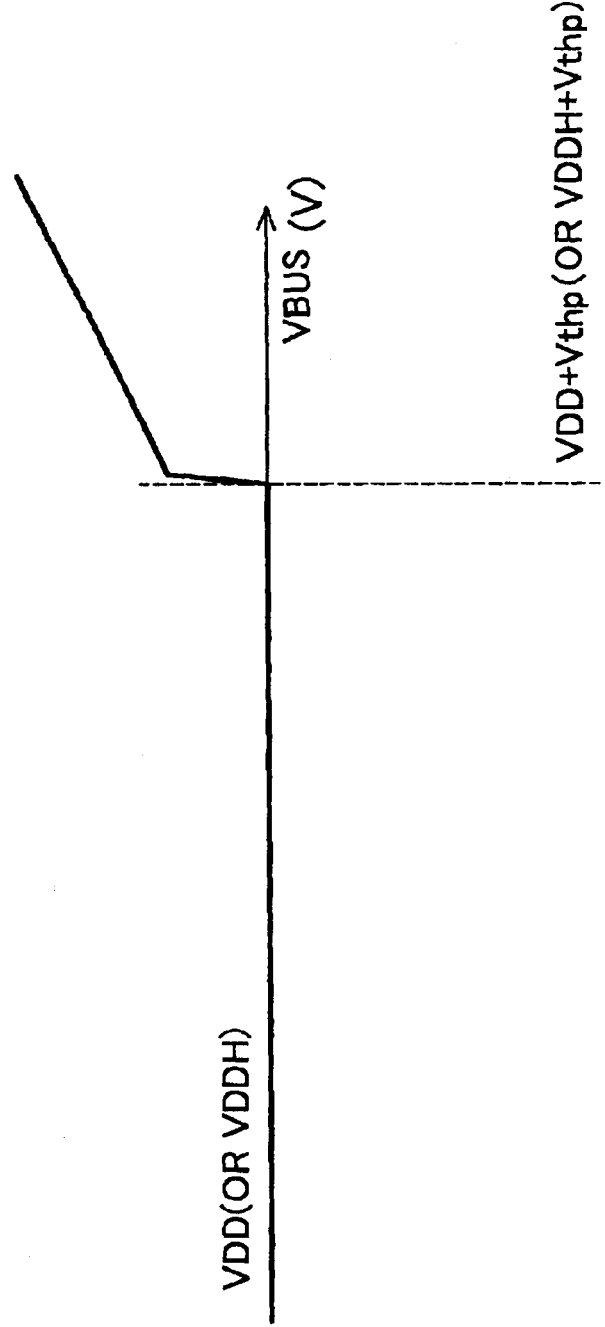
FIG. 5 is a diagram showing a characteristic of gate terminal voltage VG2 at a PMOS transistor P2 directed to the present embodiments.
Figure 6:
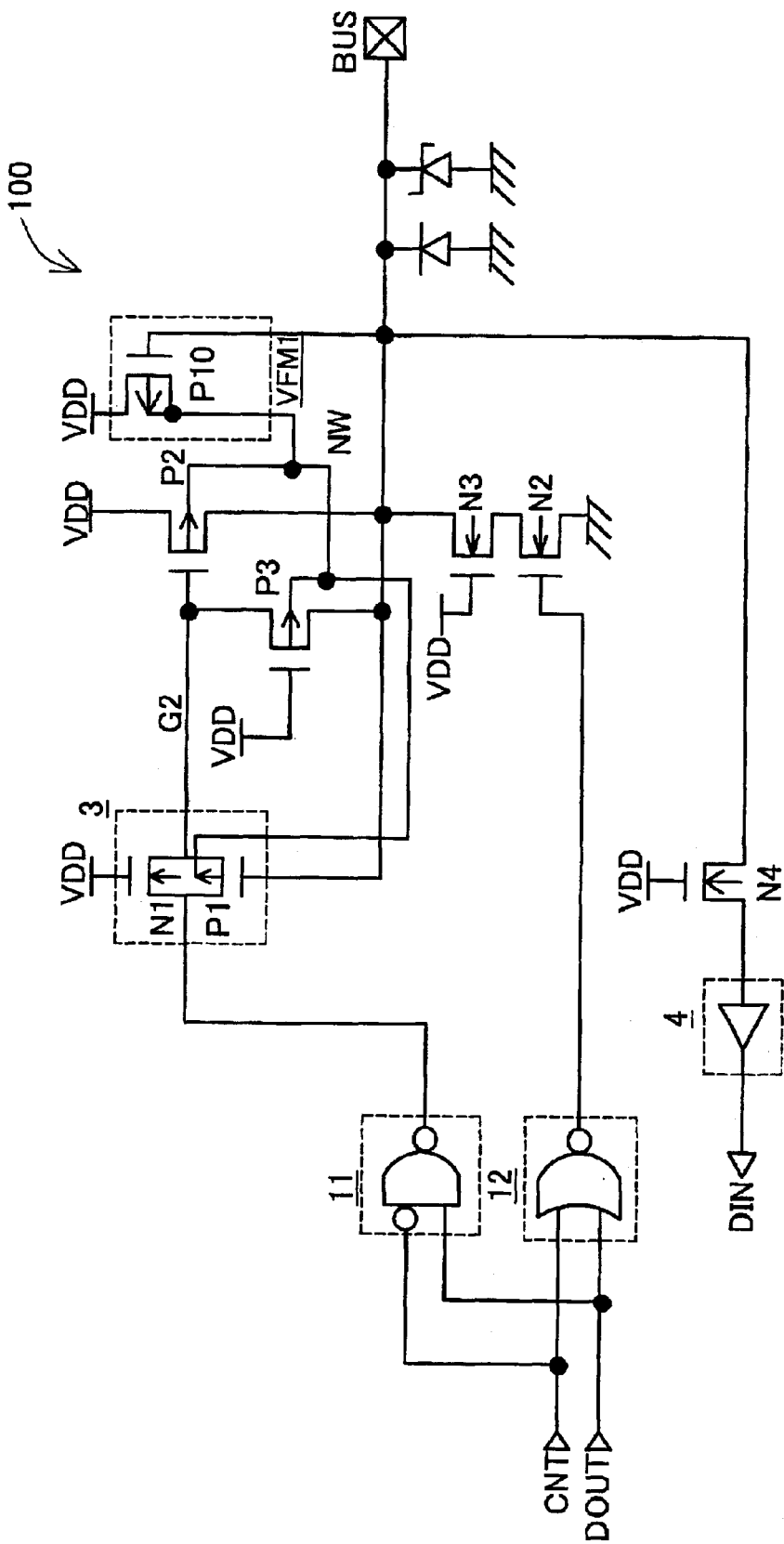
FIG. 6 shows an input/output buffer circuit directed to a first prior art.
Figure 7:
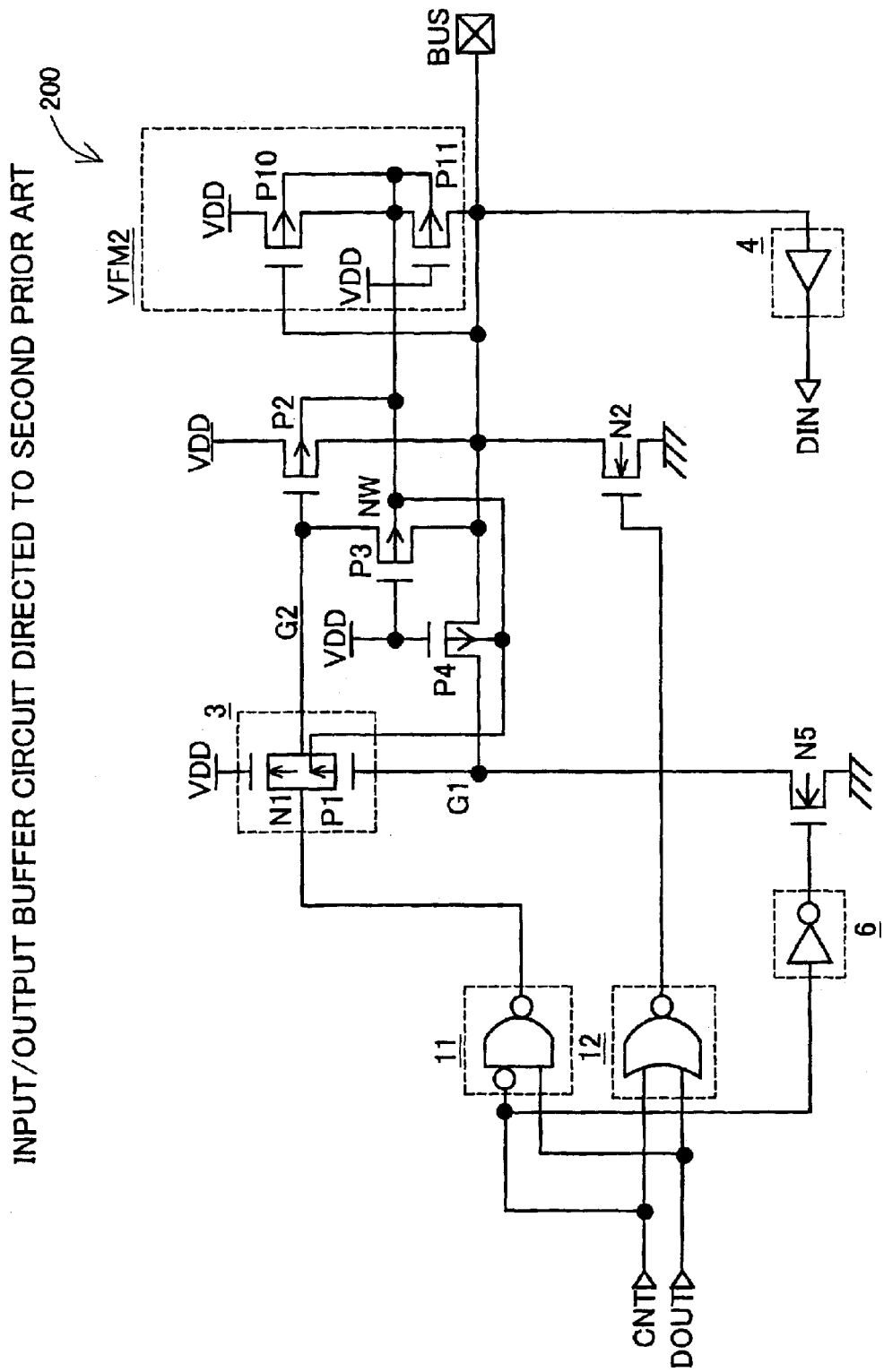
FIG. 7 shows an input/output buffer circuit directed to a second prior art.

FIG. 5 shows characteristic of the gate terminal voltage VG2 at the PMOS transistor P2. Different from the characteristic curves of the related arts, the gate terminal voltage VG2 is kept at the power source voltage VDD even if the input signal voltage VBUS is in a voltage period wherein a voltage value is between voltage obtained by subtracting threshold voltage Vthp from the power source voltage VDD and voltage obtained by adding threshold voltage Vthp to the power source voltage VDD. Accordingly, the PMOS transistor P2 does not become conductive in this voltage period and a current path is not formed between the input/output terminal BUS and the power source voltage VDD.

It is described such that voltage to be applied to the gate terminal G3 is the power source voltage VDD. However, in case the buffer circuit 5 has voltage-lowering function, voltage VDDL obtained by lowering from the power source voltage VDD is applied to the gate terminal G3. In this case, voltage VG1 to be applied to the gate terminal GI corresponds to (VDDL−Vthn) ((II) in FIG. 4) due to saturation characteristic of the NMOS transistor N6. Thereby, the PMOS transistor P1 is more surely biased to a conductive state, which is preferable for the inventive input/output buffer circuit.

Figure 2:
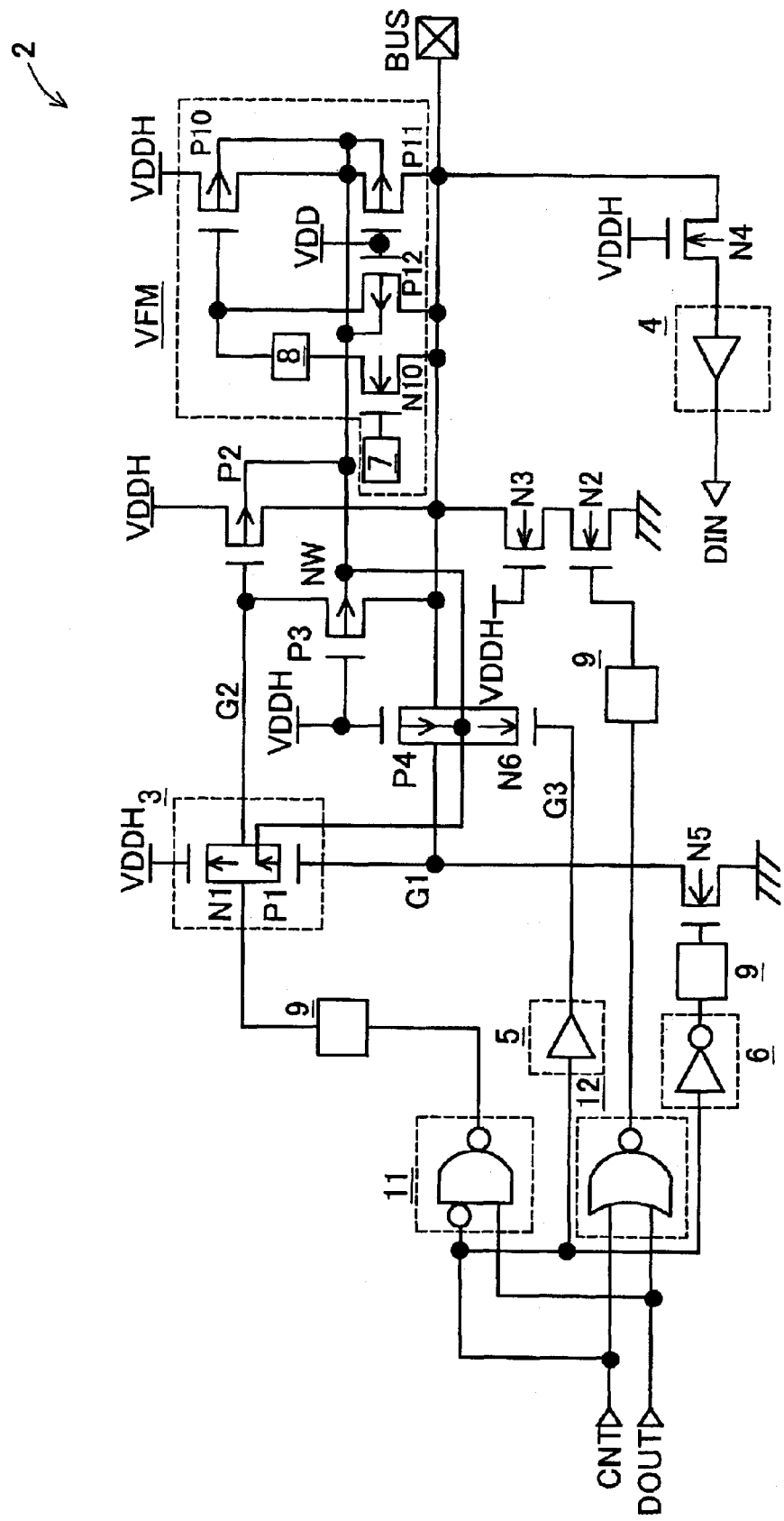
FIG. 2 shows an input/output buffer circuit directed to a second embodiment.

FIG. 2 shows an input/output buffer circuit 2 directed to a second embodiment. Different from the input/output buffer circuit 1 directed to the first embodiment, in the input/output buffer circuit 2, two types of voltage are used, namely, power source voltage VDDH used at output buffer portion for interface toward the external and internal power source voltage VDDL used in internal circuits. The internal power source voltage VDDL is lower than the power source voltage VDDH. Furthermore, level converters 9 are arranged as interface between circuit portions operable with the internal power source voltage VDDL and circuit portions operable with the power source voltage VDDH. The level converters 9 are inserted at three portions: between an NAND logic gate 11 and a transfer gate 3; between a NOR logic gate 12 and an NMOS transistor N2; and between an inverter logic gate 6 and an NMOS transistor N5. It should be noted that a level converter 9 is not arranged between a buffer circuit 5 and an NMOS transistor N6 and the internal power source voltage VDDL is applied to a gate terminal G3 of the NMOS transistor N6.

Figure 3:
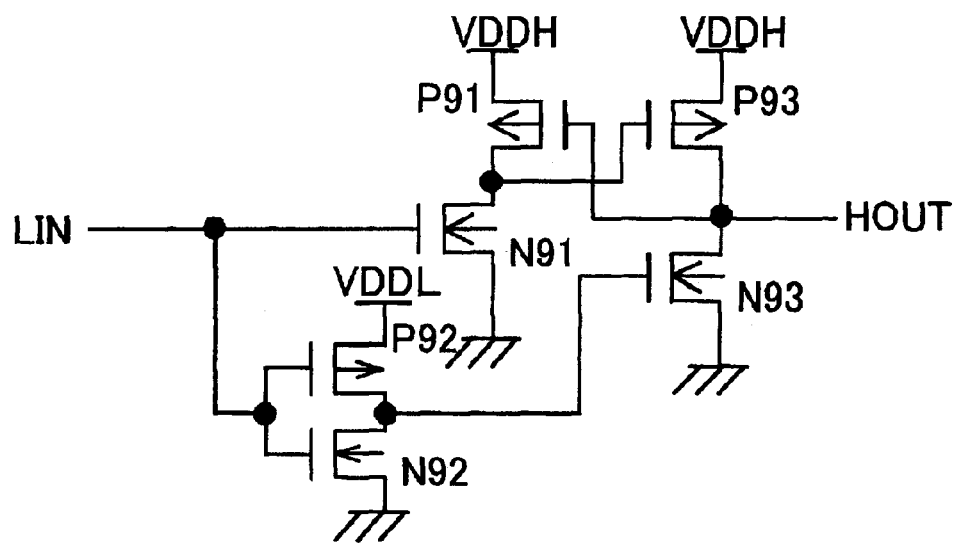
FIG. 3 shows a specific example of a level converter.

FIG. 3 shows a specific example of a level converter 9. It is an example of a circuit which converts a low-level signal LIN with amplitude of the internal power source voltage VDDL into a high-level signal HOUT with amplitude of the power source voltage VDDH.

Provided that there is inputted a high-logic level signal with voltage equivalent to the internal power source voltage VDDL as low-level signal LIN, the low-level signal LIN is inputted to a gate terminal of an NMOS transistor N91 as well as to an inverter logic gate constituted by a PMOS transistor P92 and an NMOS transistor N92. When the low-level signal LIN in high logic level is inputted, the NMOS transistor N91 becomes conductive and gate terminal voltage of the PMOS transistor P93 is set to ground voltage, whereby the PMOS transistor P93 becomes conductive. Furthermore, a low-logic level signal inverted by the inverter logic gate is inputted to a gate terminal of the NMOS transistor N93, whereby the NMOS transistor N93 becomes non-conductive. Accordingly, the power source voltage VDDH is applied to the high-level signal HOUT through the PMOS transistor P93, whereby voltage level is converted. It should be noted that the high-level signal HOUT is inputted to a gate terminal of the PMOS transistor P91, whereby a path leading to the gate terminal of the PMOS transistor P93 from the power source voltage VDDH is blocked.

Provided that there is inputted a low-logic level signal at ground voltage as low-level signal LIN, the NMOS transistor N91 becomes non-conductive and a path leading to the ground voltage from the gate terminal of the PMOS transistor P93 is blocked. On the other hand, since a high-logic level signal inverted by the inverter logic gate is inputted to the gate terminal of the NMOS transistor N93, the NMOS transistor N93 becomes conductive. Accordingly, the ground voltage is applied to the high-level signal HOUT through the NMOS transistor N93. Since the high-level signal HOUT is inputted to the gate terminal of the PMOS transistor P91, the PMOS transistor P91 becomes conductive and the power source voltage VDDH is applied to the gate terminal of the PMOS transistor P93, whereby the PMOS transistor P93 is kept in a non-conductive state.

Functions and effects of the input/output buffer circuit 2 directed to the second embodiment are the same as the input/output buffer circuit 1 directed to the first embodiment. Functions and effects obtained by applying the internal power source voltage VDDL to the gate terminal G3 of the NMOS transistor N6 is the same as the case that the input/output buffer circuit 1 includes voltage-lowering function. That is, the gate terminal voltage VG1 is equivalent to voltage obtained by subtracting the threshold voltage Vthn from the internal power source voltage VDDL lowered compared with the power source voltage VDDH (VG1=VDDL−Vthn), whereby the PMOS transistor P1 can be more surely biased to conductive state. A characteristic of the gate terminal voltage VG1 at this moment is shown as (II) in FIG. 4.

As described, in the input/output buffer circuits 1 and 2 directed to the first and second embodiments, respectively, the driving PMOS transistor P2 is kept in a non-conductive state by voltage set at the gate terminal G2 of the driving PMOS transistor P2 even if a value of the input signal voltage VBUS to be inputted to the input/output terminal BUS in an input mode varies. Therefore, an unnecessary current path is not formed between the input/output terminal BUS and the power source VDD or VDDH through the driving PMOS transistor P2, whereby inflow and outflow of unnecessary current can be avoided. Furthermore, since inflow and outflow of unnecessary current do not occur, the input/output terminal BUS can be set to predetermined voltage level.

Furthermore, in the second region where the input signal voltage VBUS corresponds to a voltage value lower than voltage obtained by adding the threshold voltage Vthp of the PMOS transistor P2 as predetermined voltage to the power source voltage VDD or VDDH, the NAND logic gate 11 or the level converter 9 as gate driving section used in an output mode is used, whereby the gate terminal G2 of the driving PMOS transistor P2 is set to the power source voltage VDD or VDDH. On the other hand, in the first region where the input signal voltage VBUS corresponds to a voltage value same as or higher than voltage obtained by adding the threshold voltage Vthp to the power source voltage VDD or VDDH, inflow current from the gate terminal G2 set to the input signal voltage VBUS is restrained. Accordingly, an unnecessary current path connecting from the input/output terminal BUS via the gate terminal G2 to the power source voltage VDD or VDDH through the NAND logic gate 11 or the level converter 9 is never formed, whereby inflow of unnecessary current can be avoided. Furthermore, since inflow of unnecessary current does not occur, the input/output terminal BUS can be set to voltage level same as or higher than the power source voltage VDD or VDDH.

Furthermore, in the second region, setting of the power source voltage VDD or VDDH to the gate terminal G2 can be realized with a circuit structure including the PMOS transistor P1 as first PMOS transistor to be inserted between the NAND logic gate 11 or the level converter 9 and the gate terminal G2.

Furthermore, even if input signal voltage VBUS same as or higher than voltage obtained by adding threshold voltage Vthp to the power source voltage VDD or VDDH is applied to the gate terminal G2, voltage to be applied to the NAND logic gate 11 or the level converter 9 is limited to voltage obtained by subtracting threshold voltage Vthn of the NMOS transistor N1 as first NMOS transistor from the power source voltage VDD or VDDH. Accordingly, in the NAND logic gate 11 or the level converter 9, a current path leading to the power source voltage VDD or VDDH is never formed, thereby to prevent current from flowing in the NAND logic gate 11 or in the level converter 9. This inflow-current avoiding function can be realized with a small-scaled circuit structure including the NMOS transistor N1.

Furthermore, since the gate terminal of the NMOS transistor N1 is connected to the power source voltage terminal, the gate terminal can be set to the power source voltage VDD in the first region without controlling a value of voltage to be applied to the gate terminal depending on voltage of the input signal voltage VBUS.

Furthermore, a first gate voltage control section can be structured with a small-scaled circuit, namely, a first transfer gate constituted by the PMOS transistor P1 and the NMOS transistor N1

Furthermore, the PMOS transistor P1 can be non-conductive in the first region whereas can be conductive in the second region. Accordingly, the NAND logic gate 11 or the level converter 9 can drive the gate terminal G2 of the driving PMOS transistor P2 in the second region, whereby the gate terminal G2 of the driving PMOS transistor P2 can be set to the power source voltage VDD or VDDH.

Furthermore, since voltage at the gate terminal G1 can be set to a voltage value same as or lower than voltage obtained by subtracting the threshold voltage from the output voltage of the NAND logic gate 11 or the level converter 9 so as to make the PMOS transistor P1 conductive, the first PMOS transistor can be made conductive more surely.

Furthermore, the PMOS transistor P1 can be non-conductive in the first region by applying the input signal voltage VBUS to the gate terminal G1. Furthermore, a small-scaled circuit structure including the PMOS transistor P4 as second PMOS transistor can make the PMOS transistor P1 non-conductive.

Since the gate terminal of the PMOS transistor P4 is connected to the power source terminal, the gate terminal can be set to the power source voltage VDD in the first region without controlling a value of voltage to be applied to the gate terminal depending on the input signal voltage VBUS.

Furthermore, voltage to be applied to the gate terminal G1 is restricted to voltage obtained by subtracting the threshold voltage Vthn of the NMOS transistor N6 as second NMOS transistor from the power source voltage VDD or VDDH in the second region, whereby the PMOS transistor P1 can be conductive. Accordingly, the NAND logic gate 11 or the level converter 9 can drive the gate terminal G2, whereby the gate terminal G2 can be set to the power source voltage VDD or VDDH. Furthermore, a small-scaled circuit structure including the NMOS transistor N6 as second NMOS transistor can make the PMOS transistor P1 conductive.

Furthermore, since lowered voltage is equivalent to lowered power source voltage, the NMOS transistor N6 can be made conductive in the second region by applying the lowered power source voltage to the gate terminal of the NMOS transistor N6 in case the lowered power source voltage is used for an internal circuit.

Furthermore, voltage of a control signal generated based on an input/output mode switching signal CNT is lowered by the buffer circuit 5 as voltage lowering section and the lowered voltage is applied to the gate terminal of the NMOS transistor N6, whereby the NMOS transistor N6 can be conductive in the second region.

Since a signal of in-phase to an input/output mode switching signal CNT is applied to the gate terminal of the NMOS transistor N6, high-level voltage can be applied to the gate terminal G3 of the NMOS transistor N6 in an input mode and the NMOS transistor N6 can be conductive in the second region without controlling a value of voltage to be applied to the gate terminal depending on the input signal voltage VBUS.

Furthermore, the second gate voltage control section can be structured with such a small-scaled circuit that a second transfer gate constituted by the PMOS transistor P4 and the NMOS transistor N6.

Furthermore, since the NMOS transistor N5 as third NMOS transistor connects the gate terminal G1 to ground voltage in an output mode, the PMOS transistor P1 can surely be conductive and the gate terminal G2 can be controlled by the NAND logic gate 11 or the level converter 9.

Figure 8:
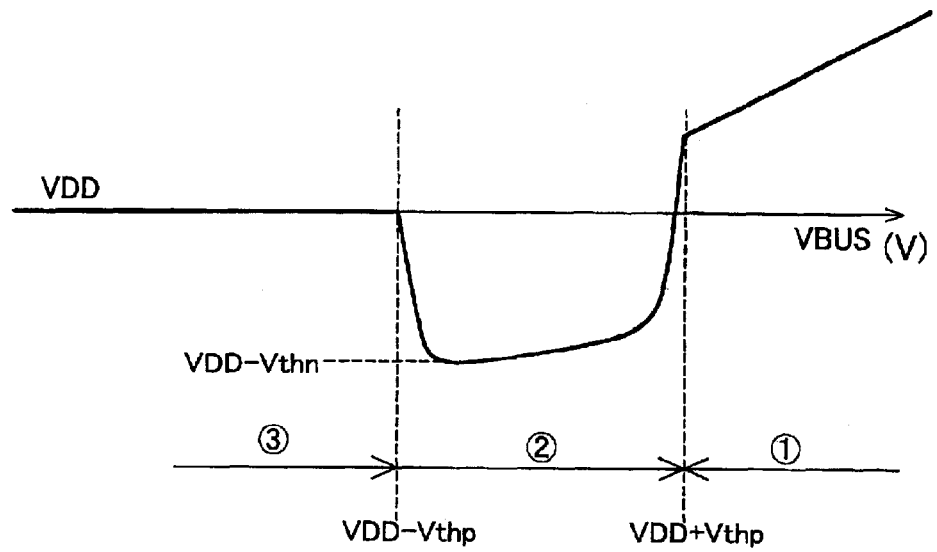
FIG. 8 is a diagram showing a characteristic of gate terminal voltage VG2 at a conventional PMOS transistor P2.
Figure 9:
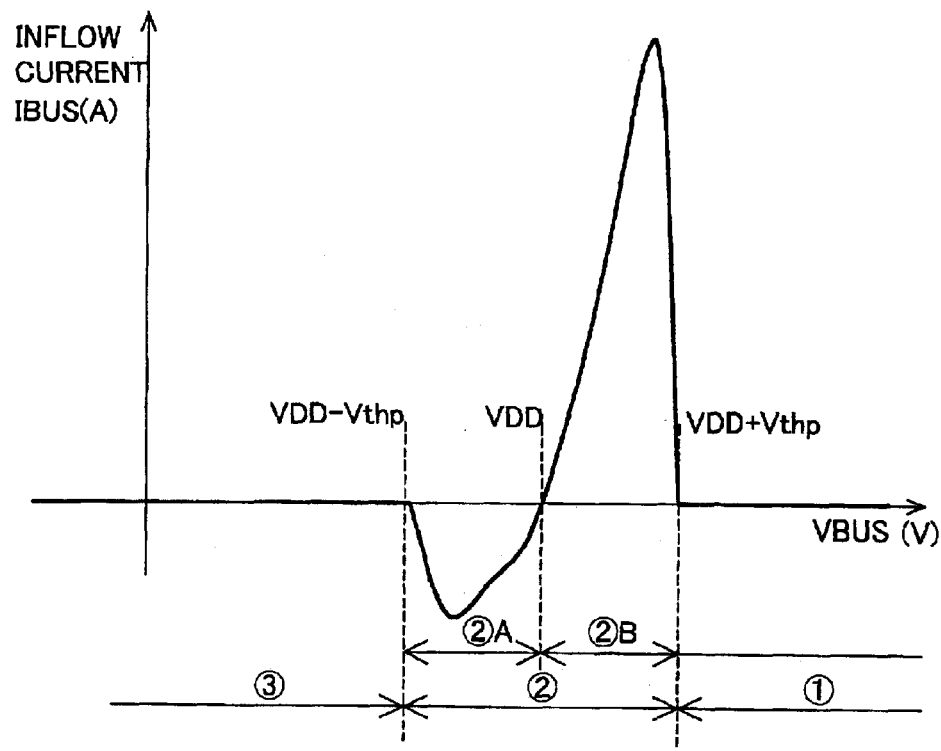
FIG. 9 is a diagram showing a characteristic of inflow current IBUS flowing in a conventional input/output terminal BUS.
Figure 10:
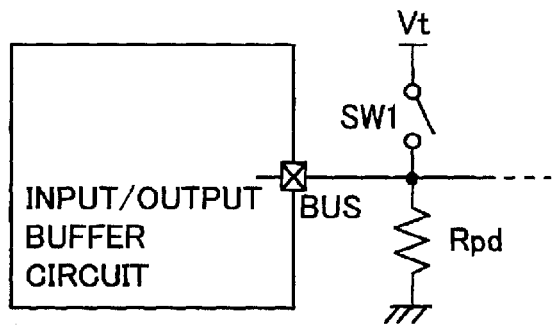
FIG. 10 is a circuit diagram in case an interface circuit including a pull-down resistance is connected to an input terminal.
Figure 11:
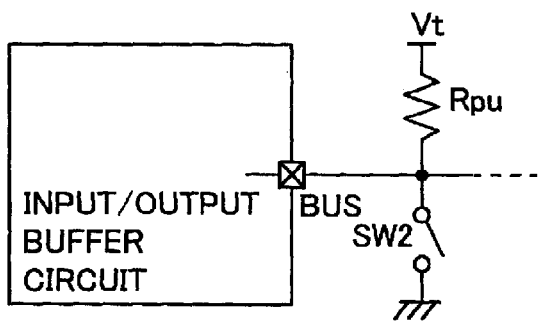
FIG. 11 is a circuit diagram in case an interface circuit including a pull-up resistance is connected to an input terminal.

When the input/output buffer circuits 1 and 2 are in an input mode, an unnecessary current path is never formed between the input/output terminal BUS and the power source voltage VDD or VDDH regardless of whether the input signal voltage VBUS is applied to the input/output terminal BUS. Accordingly, even if the input/output buffer circuits 1 and 2 are connected to an external circuit such as the interface circuit including the pull-down resistance Rpd at the input/output terminal BUS (see FIG. 8) and the interface circuit including the pull-up resistance Rpu (see FIG. 9), the input signal voltage VBUS at the input/output terminal BUS can be set for sure, whereby signals can be inputted to the input/output terminal BUS stably.

Furthermore, since the buffer circuit 5 of the input/output buffer circuit 2 directed to the second embodiment includes voltage lowering function, voltage to be applied to the gate terminal G1 is restricted to voltage obtained by subtracting threshold voltage Vthn of the NMOS transistor N6 from the internal lowering voltage VDDL or other internal lowering voltage VDDL. If the buffer circuit 5 of the input/output buffer circuit 1 directed to the first embodiment includes voltage lowering function, voltage to be applied to the gate terminal G1 can be restricted similar to the second embodiment. Accordingly, in the input/output buffer circuit 2 or 1, the gate terminal G2 is set to the power source voltage VDDH or VDD in the second region since the PMOS transistor P1 can be conductive for sure.

The present invention is not limited to the above-described first and second embodiments, but obviously various improvements and modifications are possible within a scope not deviating from the essentials of the invention.

For example, in the first and second embodiments, there are used components applicable when the power source voltage VDD or VDDH is used as the NMOS transistor N2 and the input stage of the input buffer circuit 4. Therefore, there is described a case such that the NMOS transistors N3 and N4 are provided as high-voltage protection in case input signal voltage VBUS with high voltage is applied. However, the present invention is not limited to the above-mentioned aspect. The NMOS transistor N2 and the input stage of the input buffer circuit 4 may be constituted by high-voltage proof elements without arranging the NMOS transistor N3 and N4.

According to the present invention, in an inventive input/output buffer circuit to which an input signal with voltage higher than its own power source voltage VDD is inputted, unnecessary current never flows between the power source voltage and an input signal applied from the external. Thereby, even if an external circuit is connected to an input/output terminal, voltage at the input/output terminal BUS can be set for sure and input signals can be supplied to the input/output terminal BUS stably.

What is claimed is:

1. An input/output buffer circuit comprising a driving PMOS transistor for driving an input/output terminal when in an output mode, wherein an input signal with voltage same as or higher than its power source voltage is inputted to the input/output buffer circuit through the input/output terminal when in an input mode, and under the input mode, voltage at a gate terminal of the driving PMOS transistor is set to an input signal voltage when the input signal voltage is in a first region corresponding to voltage values same as or higher than voltage obtained by adding predetermined voltage to the power source voltage, and voltage at the gate terminal of the driving PMOS transistor is set to the power source voltage when the input signal voltage is in a second region corresponding to voltage values lower than the voltage obtained by adding predetermined voltage to the power source voltage.

2. An input/output buffer circuit according to claim 1, wherein the voltage obtained by adding predetermined voltage to the power source voltage is equivalent to the input signal voltage obtained when the driving PMOS transistor starts being conductive from the input/output terminal's side to the power source voltage terminal's side.

3. An input/output buffer circuit according to claim 1, wherein the predetermined voltage is equivalent to threshold voltage of the driving PMOS transistor obtained when the driving PMOS transistor starts being conductive from the input/output terminal's side to the power source voltage terminal's side.

4. An input/output buffer circuit according to claim 1 further including:

a gate driving section for driving the gate terminal of the driving PMOS transistor when it is an output mode; and a first gate voltage control section arranged between the gate driving section and the gate terminal of the driving PMOS transistor, the first gate voltage control section preventing current from flowing to the gate driving section from the gate terminal of the driving PMOS transistor set to the input signal voltage when the input signal voltage is in the first region and allowing the gate driving section and the gate terminal of the driving PMOS transistor to be conductive when the input signal voltage is in the second region.

5. An input/output buffer circuit according to claim 4, wherein the first gate voltage control section includes a first PMOS transistor whose drain terminal and source terminal are connected to the gate driving section's side and the gate terminal's side of the driving PMOS transistor, respectively, and the first PMOS transistor is conductive when the input signal voltage is in the second region.

6. An input/output buffer circuit according to claim 4, wherein the first gate voltage control section includes a first NMOS transistor whose drain terminal and source terminal are connected to the gate driving section's side and the gate terminal's side of the driving PMOS transistor, respectively, and the power source voltage is applied to the gate terminal of the first NMOS transistor when the input signal voltage is in the first region.

7. An input/output buffer circuit according to claim 6, wherein the gate terminal of the first NMOS transistor is connected to a power source voltage terminal.

8. An input/output buffer circuit according to claim 5 wherein the first gate voltage control section includes a first transfer gate inclusive of the first PMOS transistor.

9. An input/output buffer circuit according to claim 5 further including a second gate voltage control section which sets the gate terminal of the first PMOS transistor to the input signal voltage when the input signal voltage is in the first region and sets the gate terminal of the first PMOS transistor to a value same as or lower than voltage obtained by lowering the power source voltage down to voltage allowing the first PMOS transistor to start being conductive when the input signal voltage is in the second region.

10. An input/output buffer circuit according to claim 9, wherein the voltage allowing the first PMOS transistor to start being conductive is equivalent to threshold voltage of the first PMOS transistor.

11. An input/output buffer circuit according to claim 9, wherein the second gate voltage control section includes a second PMOS transistor whose source terminal and drain terminal are connected to the input/output terminal's side and gate terminal's side of the first PMOS transistor, respectively, and the power source voltage is applied to the gate terminal when the input signal voltage is in the first region.

12. An input/output buffer circuit according to claim 11, wherein the gate terminal of the second PMOS transistor is connected to a power source voltage terminal.

13. An input/output buffer circuit according to claim 9,
wherein the second gate voltage control section includes a second NMOS transistor whose drain terminal and source terminal are connected to the input/output terminal's side and gate terminal's side of the first PMOS transistor, respectively, and whose gate terminal is controlled by an input/output mode switching signal, and the power source voltage is applied to the gate terminal of the second NMOS transistor when the input signal voltage is in the second region.

14. An input/output buffer circuit according to claim 13, wherein, instead of the power source voltage, lowered voltage is applied to the gate terminal of the second NMOS transistor.

15. An input/output buffer circuit according to claim 14, wherein the lowered voltage is equivalent to voltage obtained by lowering the power source voltage.

16. An input/output buffer circuit according to claim 14 further including a voltage lowering section, wherein the lowered voltage is equivalent to voltage outputted from the voltage lowering section.

17. An input/output buffer circuit according to claim 13,
wherein a signal of in-phase to the input/output mode switching signal is applied to the gate terminal of the second NMOS transistor when the input/output mode switching signal is a positive logic signal under an input mode, and a signal of opposite phase to the input/output mode switching signal is applied to the gate terminal of the second NMOS transistor when the input/output mode switching signal is a negative logic signal under an input mode.

18. An input/output buffer circuit according to claim 11, wherein the second gate voltage control section includes a second transfer gate inclusive of the second PMOS transistor.

19. An input/output buffer circuit according to claim 5, wherein the first PMOS transistor is kept in a conductive state under an output mode.

20. An input/output buffer circuit according to claim 19 further including a third NMOS transistor whose drain terminal and source terminal are connected to the gate terminal's side of the first PMOS transistor and ground voltage's side, respectively, and the third NMOS transistor is conductive under an output mode.

21. An input/output buffer circuit according to claim 20,
wherein a signal of in-phase to the input/output mode switching signal is applied to the gate terminal of the third NMOS transistor when the input/output mode switching signal is a positive logic signal under an output mode, and a signal of the opposite phase to the input/output mode switching signal is applied to the gate terminal of the third NMOS transistor when the input/output mode switching signal is a negative logic signal under an output mode.

* * * * *